(12) United States Patent
Ide

(10) Patent No.: US 6,506,256 B2
(45) Date of Patent: Jan. 14, 2003

(54) METHOD AND APPARATUS FOR DIFFUSION OF AN IMPURITY INTO A SEMICONDUCTOR WAFER WITH HIGH IN-PLANE DIFFUSION UNIFORMITY

(75) Inventor: Shigeaki Ide, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/001,798

(22) Filed: Dec. 5, 2001

(65) Prior Publication Data

US 2002/0042190 A1 Apr. 11, 2002

Related U.S. Application Data

(62) Division of application No. 09/240,988, filed on Feb. 1, 1999, now Pat. No. 6,348,397.

(30) Foreign Application Priority Data

Jan. 30, 1998 (JP) .............................. 10-019928

(51) Int. Cl.$^7$ .............................. C23C 16/00; F27B 9/04
(52) U.S. Cl. .................. 118/724; 118/500; 118/725; 118/729; 118/730; 427/248.1; 432/152; 432/205
(58) Field of Search .................. 438/550, 554, 438/565, 566, 715, 716, 724, 725, 729, 730, 733, 542; 118/715, 722, 723, 728, 729, 725, 730, 119, 500, 724; 432/120, 121, 152, 200, 205; 257/607, 655; 427/248.1

(56) References Cited

U.S. PATENT DOCUMENTS

| | | | |
|---|---|---|---|
| 5,401,686 A | 3/1995 | Kiyose ................. | 438/550 |
| 5,444,217 A | 8/1995 | Moore et al. .......... | 219/405 |
| 5,571,333 A | 11/1996 | Kanaya ................ | 118/724 |
| 5,645,417 A | 7/1997 | Smith ................. | 432/152 |
| 5,785,762 A | 7/1998 | Masuda ............... | 118/666 |
| 5,902,102 A | 5/1999 | Nam et al. ........... | 432/152 |
| 6,045,619 A | 4/2000 | Tai et al. ............ | 118/724 |
| 6,110,289 A * | 8/2000 | Moore ................ | 118/725 |
| 6,120,285 A | 9/2000 | Smith ................ | 432/152 |
| 6,129,048 A | 10/2000 | Sullivan ............. | 118/728 |
| 6,137,088 A | 10/2000 | Chen et al. .......... | 219/390 |
| 6,245,147 B1 * | 6/2001 | Kobayashi ........... | 118/500 |
| 6,316,748 B1 * | 11/2001 | Ide .................. | 219/390 |
| 6,348,397 B2 * | 2/2002 | Ide .................. | 438/565 |

FOREIGN PATENT DOCUMENTS

| | | |
|---|---|---|
| EP | 158570 | 10/1985 |
| JP | 4350927 | 12/1992 |
| JP | 6183883 | 7/1994 |
| JP | 8227860 | 9/1996 |
| JP | 8316222 | 11/1996 |
| JP | 1019928 | 1/1998 |
| JP | 1167750 | 3/1999 |

* cited by examiner

*Primary Examiner*—Kamand Cuneo
*Assistant Examiner*—Alonzo Chambliss
(74) *Attorney, Agent, or Firm*—Young & Thompson

(57) ABSTRACT

The present invention provides an apparatus for diffusing an impurity into a semiconductor wafer comprising: a diffusion furnace tubs which has a longitudinal center axis extending along a vertical direction and the diffusion tube having at least a gas injector vertically extending in a vicinity of an inner wall of the diffusion furnace tube and the gas injector having a single vertical alignment of a plurality of gas injection nozzles for blowing an impurity gas toward the longitudinal center axis in a first horizontal direction; and a wafer holder for holding at least one semiconductor wafer, the wafer holder being provided in the diffusion furnace tube so that the wafer holder rotates around a rotational axis extending along the vertical axis, whereby the at least one semiconductor wafer rotates around the rotational axis so as to keep a normal of the at least one semiconductor wafer directed in a diametrically outward direction from the rotational center axis.

3 Claims, 5 Drawing Sheets

METHOD AND APPARATUS FOR DIFFUSION OF AN IMPURITY INTO A SEMICONDUCTOR WAFER WITH HIGH IN-PLANE DIFFUSION UNIFORMITY

This application is a division of application Ser. No. 09/240,988, filed on Feb. 1, 1999, U.S. Pat. No. 6,348,397 which the entire contents of which are hereby incorporated by reference.

BACKGROUND OF THE INVENTION

The present invention relates to a method and an apparatus for diffusion of an impurity into a semiconductor wafer with a high in-plane diffusion uniformity over an entire surface of the semiconductor wafer.

A vertical diffusion furnace was used for a diffusion of an impurity into a semiconductor wafer by use of a vertical diffusion furnace. FIG. 1 is a schematic cross sectional elevation view illustrative of the conventional apparatus for diffusing an impurity into semiconductor wafers. FIG. 2 is a plane view illustrative of a furnace core tube of the conventional apparatus for diffusing an impurity into semiconductor wafers. The conventional apparatus has a furnace core tube 1 and quartz boards 2 provided in the furnace core tube 1 for holding semiconductor wafers 2. The conventional apparatus also has an impurity source container 4 for reserving an impurity source such as $POCl_3$ and a mass flow controller 5 for controlling a flow rate of a nitrogen gas to be supplied into the impurity source container 4. The conventional apparatus also has a gas injector 6 for injecting an impurity gas into the furnace core tube 1 and a gas feeding pipe 7 for feeding oxygen and nitrogen gases into the furnace core tube 1. The conventional apparatus also has a heater 8 for heating the furnace core tube 1.

The semiconductor wafers 2 are supported or held by the quartz boards so that the semiconductor wafers 2 lie horizontally whereby the normal of plane of the semiconductor wafer 2 is vertically directed. The gas injector 6 has a vertical alignment of a plurality of gas injection nozzles 6A along a longitudinal direction. The furnace core tube 1 has a vertical center axis. The gas injection nozzles 6A inject the impurity gases in a horizontal direction and toward the vertical center axis of the furnace core tube 1 but uniformly in the vertical direction.

The diffusion process for diffusing the impurity into the wafers is carried out as follows.

One hundred or two hundreds semiconductor wafers 2 are loaded on the quartz boards 3 so that the semiconductor wafers 2 horizontally lie in parallel to the horizontal direction to which the gas injection nozzles 6A are directed. The quartz boards 3 are inserted into the diffusion furnace tube 1 heated up to a predetermined temperature so that the diffusion furnace tube 1 rotates around the rotational axis vertically extending at a predetermined rotational rate.

A nitrogen gas is introduced through the mass flow controller 5 into the impurity source container 4 at a predetermined flow rate for forming an impurity gas which is to be supplied through the gas injector 6 and the gas injection nozzles 6A into the diffusion furnace tube 1.

Oxygen and nitrogen gases are fed through a gas feeding pipe 7 into the diffusion furnace tube 1, at flow rates of 0.1–5 liters/min. and 5–30 liters/min., respectively, so that those gases are reacted with the impurity gas on the surfaces of the semiconductor wafers 2, whereby a glass layer containing impurities such as phosphorus glasses is formed on the surfaces of each of the semiconductor wafers 2.

Subsequently, a heat treatment is carried out to diffuse the impurity from the glass layer into the semiconductor wafer 2. The diffused impurity in the semiconductor wafer 2 is further activated by a further heat treatment so that the activated impurity serves as an n-type impurity or a donor in the semiconductor wafer.

The semiconductor wafers 2 are loaded on the quartz boards 3 so that the semiconductor wafers 2 horizontally lie. During rotation of the quartz boards 3 along with the semiconductor wafers 2, faces of the semiconductor wafers 2 remain directed in upward direction. A difference in distance of the center of the wafer 2 to the gas injection nozzle 6A from the peripheral portion of the wafer to the same gas injection nozzle 6A is so large, whereby the impurity gas is not uniformly supplied onto the entire surfaces of each of the semiconductor wafers. If, for example, the wafer has a diameter of 150 millimeters and four semiconductor wafers 2 are loaded on each stage of the assemble of the quartz boards 3, a difference in distance of the center of the wafer 2 to the gas injection nozzle 6A from the peripheral portion of the wafer to the same gas injection nozzle 6A is 75 millimeters.

When the impurity diffusion process is carried out by use of a vertical type diffusion furnace, it is necessary to prevent diffusions of other impurities than the diffusion-purpose impurity. For this purpose, the high purity quartz boards for supporting the wafer is preferable other than use of a more complicated mechanism such as clump. In place of the quartz boards, high purity silicon carbide and polycrystalline silicon are also preferably useable. This is disclosed in Japanese laid-open patent publication No. 8-227860.

In Japanese laid-open patent publication No. 6-183883, it is disclosed to realize a possible uniform vapor phase epitaxy by rotating semiconductor wafers around a vertically extending rotational axis, wherein the semiconductor wafers on a side wall of a scepter on rotation are exposed to down flow of the reaction gas along the surfaces of the semiconductor wafers. There is a large difference in distance of the center of the wafer from the gas injection nozzle from the peripheral portion of the wafer from the same gas injection nozzle, for which reason even if this method is applied to the impurity diffusion process, it is difficult to obtain a high in-plane uniformity of impurity diffusion over an entire surface of the wafer.

In Japanese laid-open patent publication No. 8-316222, it is disclosed that a single wafer holder for holding a single semiconductor wafer is varied in direction around a center of the single semiconductor wafer. This holder is not applicable to the above apparatus for diffusions of impurity into a plurality of the semiconductor wafers in the furnace core tube.

In accordance the prior art, the above conventional structures for holding the semiconductor wafers do allow no in-plane uniform supply of an impurity onto an entire surface of each of the semiconductor wafers, whereby no in-plane uniform diffusion of the impurity over the entire surface of the semiconductor wafer is caused and no in-plane uniform impurity concentration over the entire surface of the semiconductor wafer is obtained. This further allows no improvement in in-plane uniformity of characteristics of the semiconductor devices such as transistors on the semiconductor wafers.

In the above circumstances, it had been required to develop novel method and apparatus for diffusion of an impurity into semiconductor wafers free from the above problems.

SUMMARY OF THE INVENTION

Accordingly, it is an object of the present invention to provide a novel apparatus for diffusion of an impurity into semiconductor wafers free from the above problems.

It is a further object of the present invention to provide a novel apparatus for diffusion of an impurity into a semiconductor wafer to obtain a highly in-plane uniform supply of impurity over an entire of the semiconductor wafer.

It is a still further object of the present invention to provide a novel apparatus for diffusion of an impurity into a semiconductor wafer to obtain a highly in-plane uniform diffusion of impurity over an entire of the semiconductor wafer.

It is yet a further object of the present invention to provide a novel apparatus for diffusion of an impurity into a semiconductor wafer to obtain a highly in-plane uniform impurity concentration over an entire of the semiconductor wafer.

It is a further more object of the present invention to provide a novel process for diffusion of an impurity into a semiconductor wafer.

It is still more object of the present invention to provide a novel process for diffusion of an impurity into a semiconductor wafer to obtain a highly in-plane uniform supply of impurity over an entire of the semiconductor wafer.

It is moreover object of the present invention to provide a novel process for diffusion of an impurity into a semiconductor wafer to obtain a highly in-plane uniform diffusion of impurity over an entire of the semiconductor wafer.

It is another object of the present invention to provide a novel apparatus for diffusion of an impurity into a semiconductor wafer to obtain a highly in-plane uniform impurity concentration over an entire of the semiconductor wafer.

The first embodiment provides an apparatus for diffusing an impurity into a semiconductor wafer comprising: a diffusion furnace tube which has a longitudinal center axis extending along a vertical direction and the diffusion tube having at least a gas injector vertically extending in a vicinity of an inner wall of the diffusion furnace tube and the gas injector having a single vertical alignment of a plurality of gas injection nozzles for blowing an impurity gas toward the longitudinal center axis in a first horizontal direction; and a wafer holder for holding at least one semiconductor wafer, the wafer holder being provided in the diffusion furnace tube so that the wafer holder rotates around a rotational axis extending along the vertical axis, whereby the at least one semiconductor wafer rotates around the rotational axis so as to keep a normal of the at least one semiconductor wafer directed in a diametrically outward direction from the rotational center axis.

In accordance the present invention, the above novel structure for holding the semiconductor wafers allows a in-plane uniform supply of an impurity onto an entire surface of each of the semiconductor wafers, whereby a in-plane uniform diffusion of the impurity over the entire surface of the semiconductor wafer is caused and an in-plane uniform impurity concentration over the entire surface of the semiconductor wafer is obtained. This further allows improvements in in-plane uniformity of characteristics of the semiconductor devices such as transistors on the semiconductor wafers.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
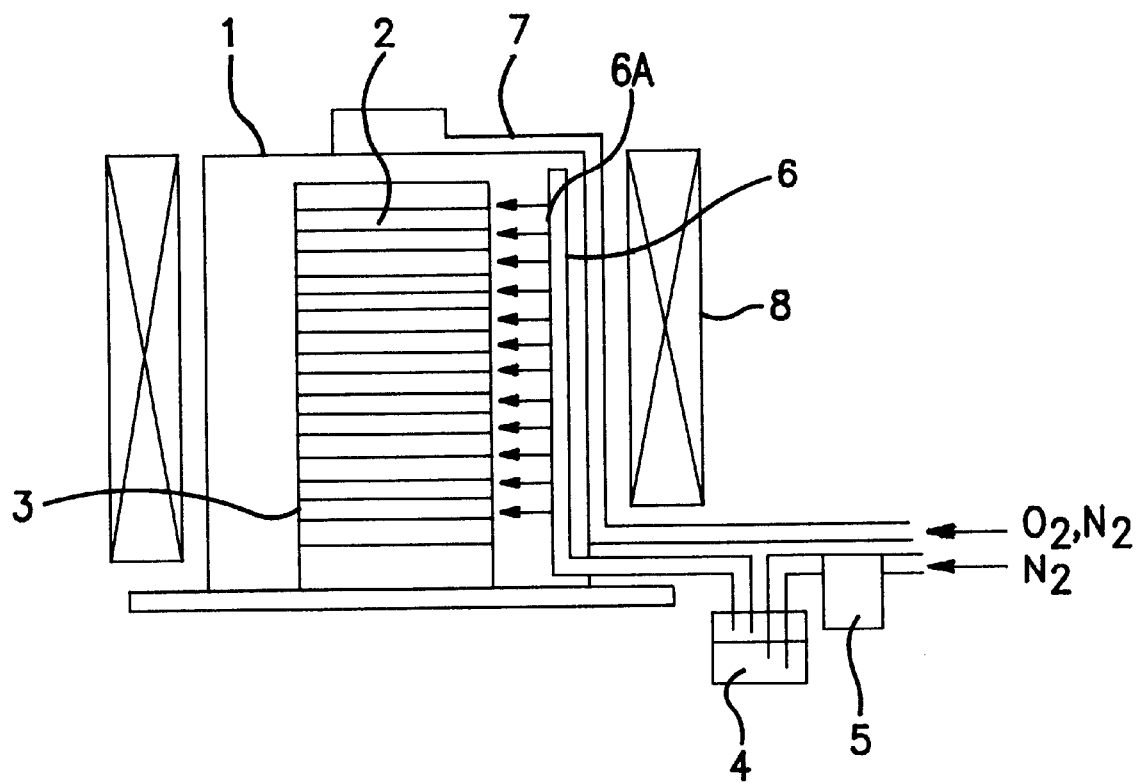
FIG. 1 is a schematic cross sectional elevation view illustrative of the conventional apparatus for diffusing an impurity into semiconductor wafers.
Figure 2:
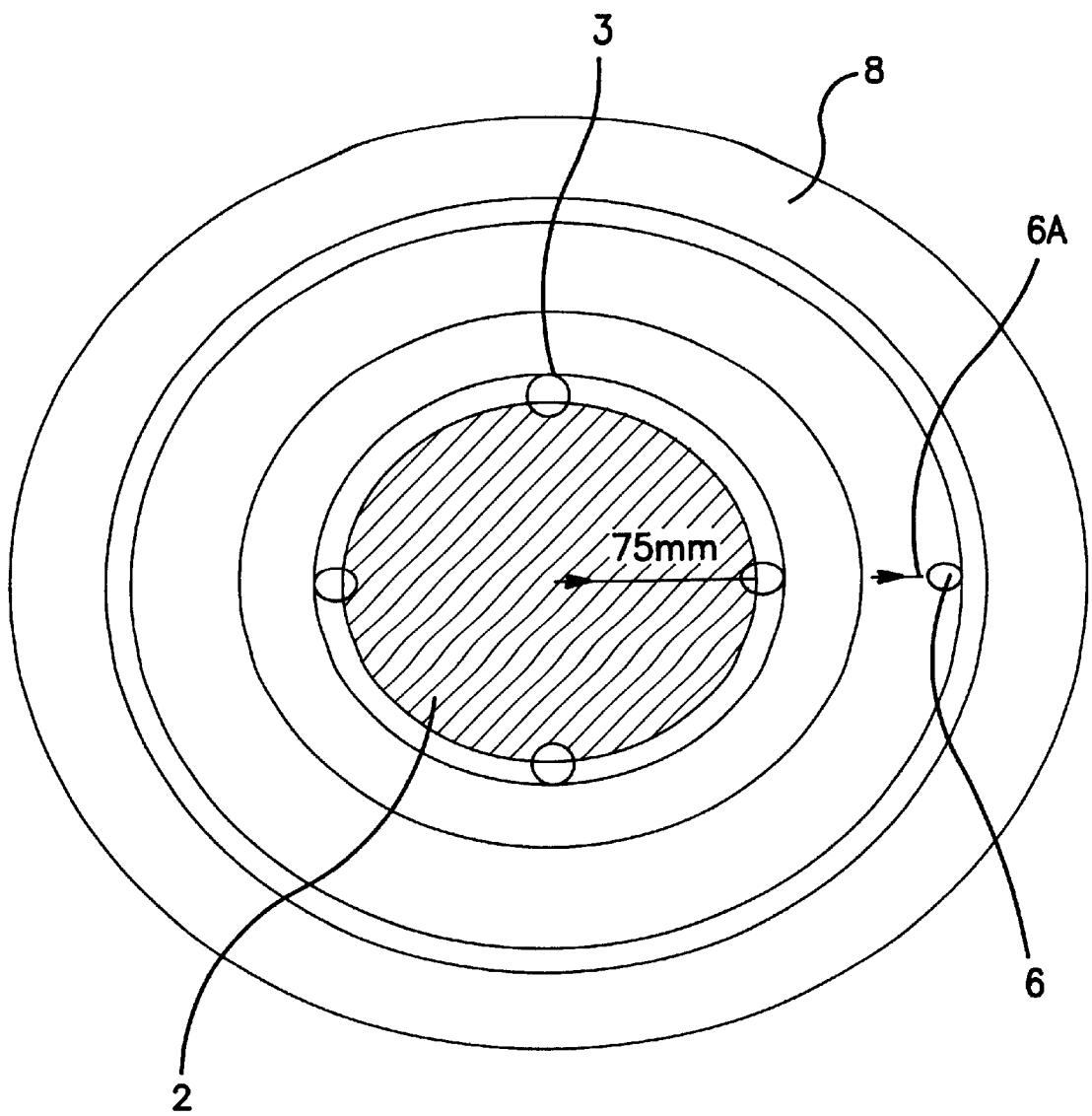
FIG. 2 is a plane view illustrative of a furnace core tube of the conventional apparatus for diffusing an impurity into semiconductor wafers.

The first present invention provides an apparatus for diffusing an impurity into a semiconductor wafer comprising: a diffusion furnace tube which has a longitudinal center axis extending along a vertical direction and the diffusion tube having at least a gas injector vertically extending in a vicinity of an inner wall of the diffusion furnace tube and the gas injector having a single vertical alignment of a plurality of gas injection nozzles for blowing an impurity gas toward the longitudinal center axis in a first horizontal direction; and a wafer holder for holding at least one semiconductor wafer, the wafer holder being provided in the diffusion furnace tube so that the wafer holder rotates around a rotational axis extending along the vertical axis, whereby the at least one semiconductor wafer rotates around the rotational axis so as to keep a normal of the at least one semiconductor wafer directed in a diametrically outward direction from the rotational center axis.

It is preferable that when a center of the at least semiconductor wafer comes; most close to the injection nozzles, an included angle between the first horizontal direction along which the impurity gas is blown and a normal of the at least semiconductor wafer is in a range of 90 degrees ±10 degrees.

It is also preferable that when the wafer holder comprises a plurality of stages, each of which has a rectangular parallelepiped shape having four side faces arranged to surround the rotational axis and a pair of top and bottom faces vertical to the rotational axis, and each of the four side faces has a single semiconductor wafer in parallel to the face.

It is also preferable that when the wafer holder comprises a plurality of stages, each of which has a cubic shape having four side faces arranged to surround the rotational axis and a pair of top and bottom faces vertical to the, rotational axis, and each of the four side faces has a single semiconductor wafer in parallel to the face.

In accordance the present invention, the above novel structure for holding the semiconductor wafers allows a in-plane uniform supply of an impurity onto an entire surface of each of the semiconductor wafers, whereby a in-plane uniform diffusion of the impurity over the entire surface of the semiconductor wafer is caused and an in-plane uniform impurity concentration over the entire surface of the semiconductor wafer is obtained. This further allows improvements in in-plane uniformity of characteristics of the semiconductor devices such as transistors on the semiconductor wafers.

The second present invention provides a method of diffusing an impurity into a semiconductor wafer, wherein an impurity gas is blown in a first horizontal direction from at least a single vertical alignment of a plurality of gas injection nozzles of a gas injector vertically extending in a vicinity of an inner wall of a diffusion furnace tube toward a vertically extending rotational axis of a wafer holder for holding at least a semiconductor wafer and rotating around the rotational axis, whereby the at least one semiconductor wafer rotates around the rotational axis so as to keep a normal of the at least one semiconductor wafer directed in a diametrically outward direction from the rotational center axis.

It is preferable that when when a center of the at least semiconductor wafer comes most close to the injection nozzles, an included angle between the first horizontal direction along which the impurity gas is blown and a normal of the at least semiconductor wafer is in a range of 90 degrees ±10 degrees.

It is also preferable that when the wafer holder comprises a plurality of stages, each of which has a rectangular parallelepiped shape having four side faces arranged to surround the rotational axis and a pair of top and bottom faces vertical to the rotational axis, and each of the four side faces has a single semiconductor wafer in parallel to the face.

It is also preferable that when the wafer holder comprises a plurality of stages, each of which has a cubic shape having four side faces arranged to surround the rotational axis and a pair of top and bottom faces vertical to the rotational axis, and each of the four side faces has a single semiconductor wafer in parallel to the face.

In accordance the present invention, the above novel structure for holding the semiconductor wafers allows a in-plane uniform supply of an impurity onto an entire surface of each of the semiconductor wafers, whereby a in-plane uniform diffusion of the impurity over the entire surface of the semiconductor wafer is caused and an in-plane uniform impurity concentration over the entire surface of the semiconductor wafer is obtained This further allows improvements in in-plane uniformity of characteristics of the semiconductor devices such as transistors on the semiconductor wafers.

PREFERRED EMBODIMENTS
First Embodiment

Figure 3:
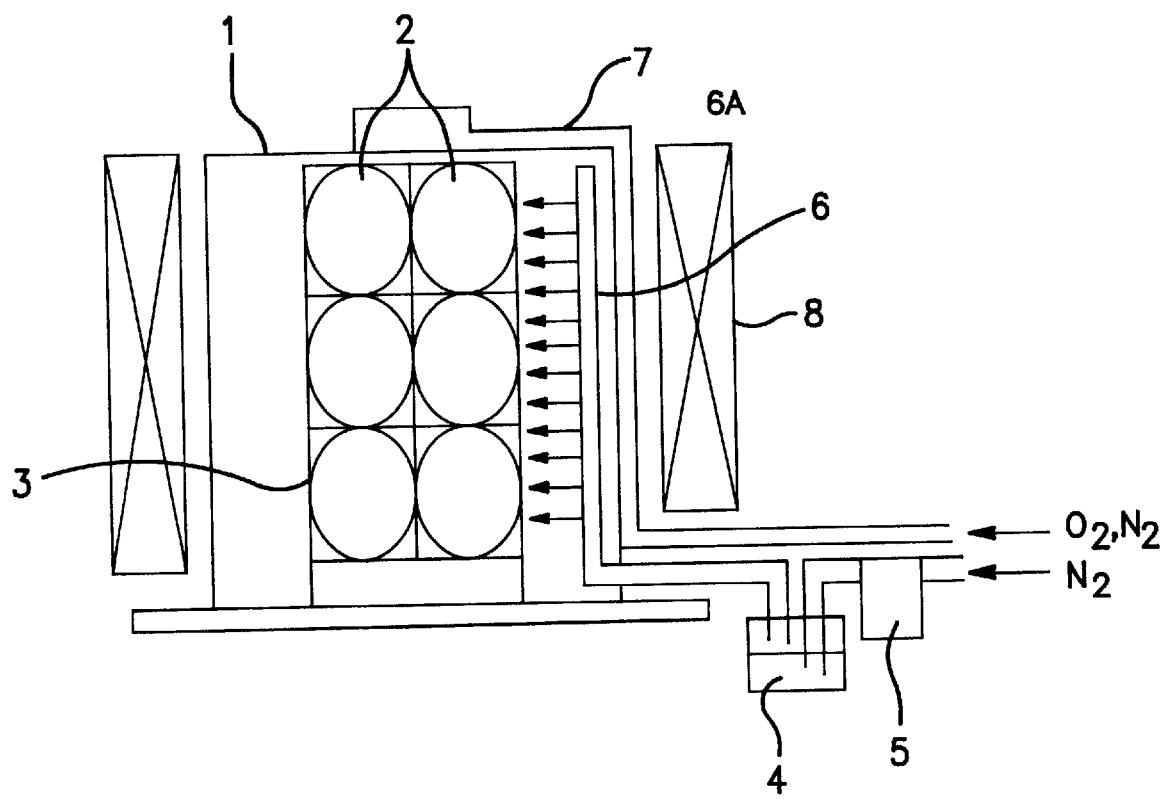
FIG. 3 is a schematic cross sectional elevation view illustrative of a novel apparatus for diffusing an impurity into semiconductor wafers in a preferred embodiment in accordance with the present invention.
Figure 4:
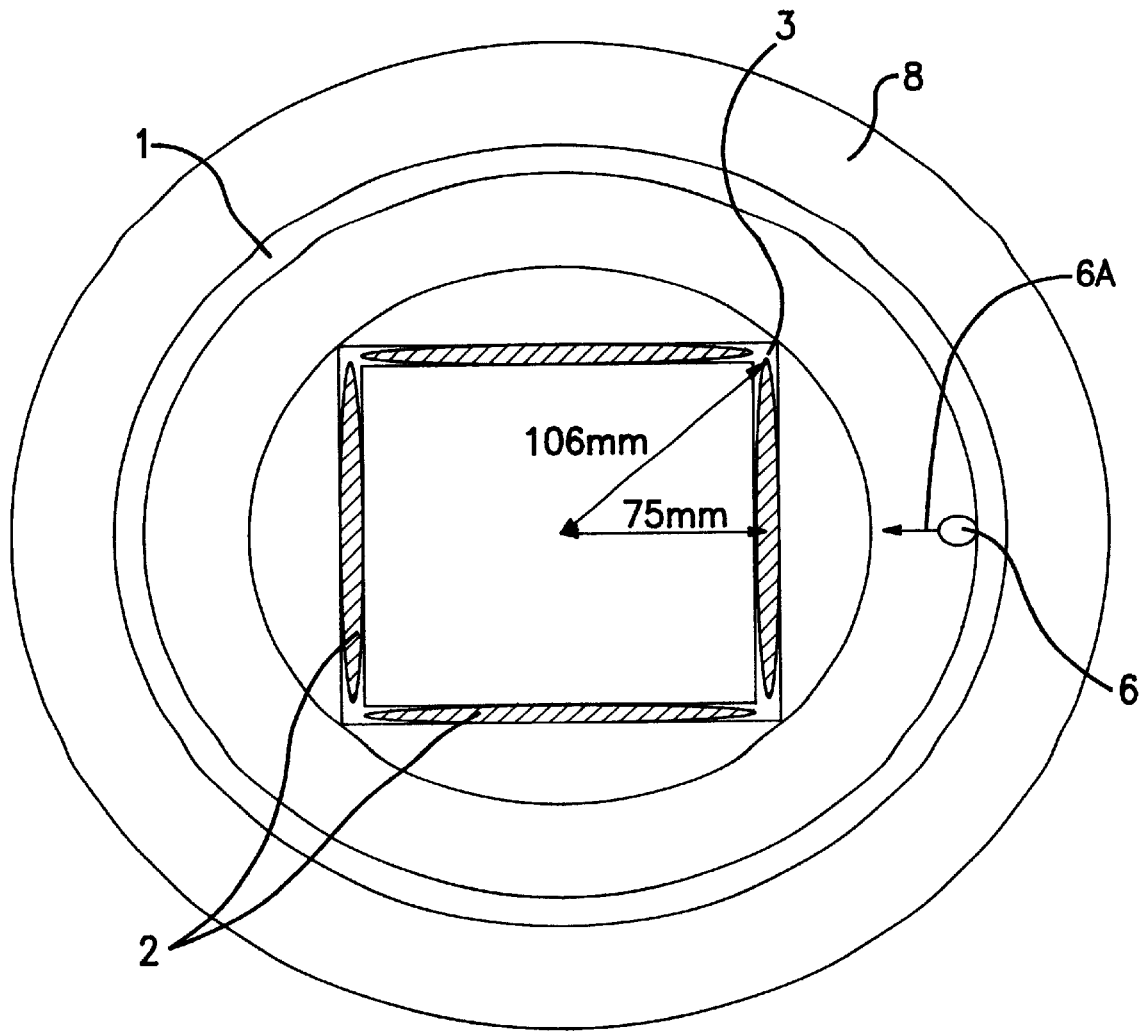
FIG. 4 is a plane view illustrative of a furnace core tube of a novel apparatus for diffusing an impurity into semiconductor wafers in a preferred embodiment in accordance with the present invention.
Figure 5:
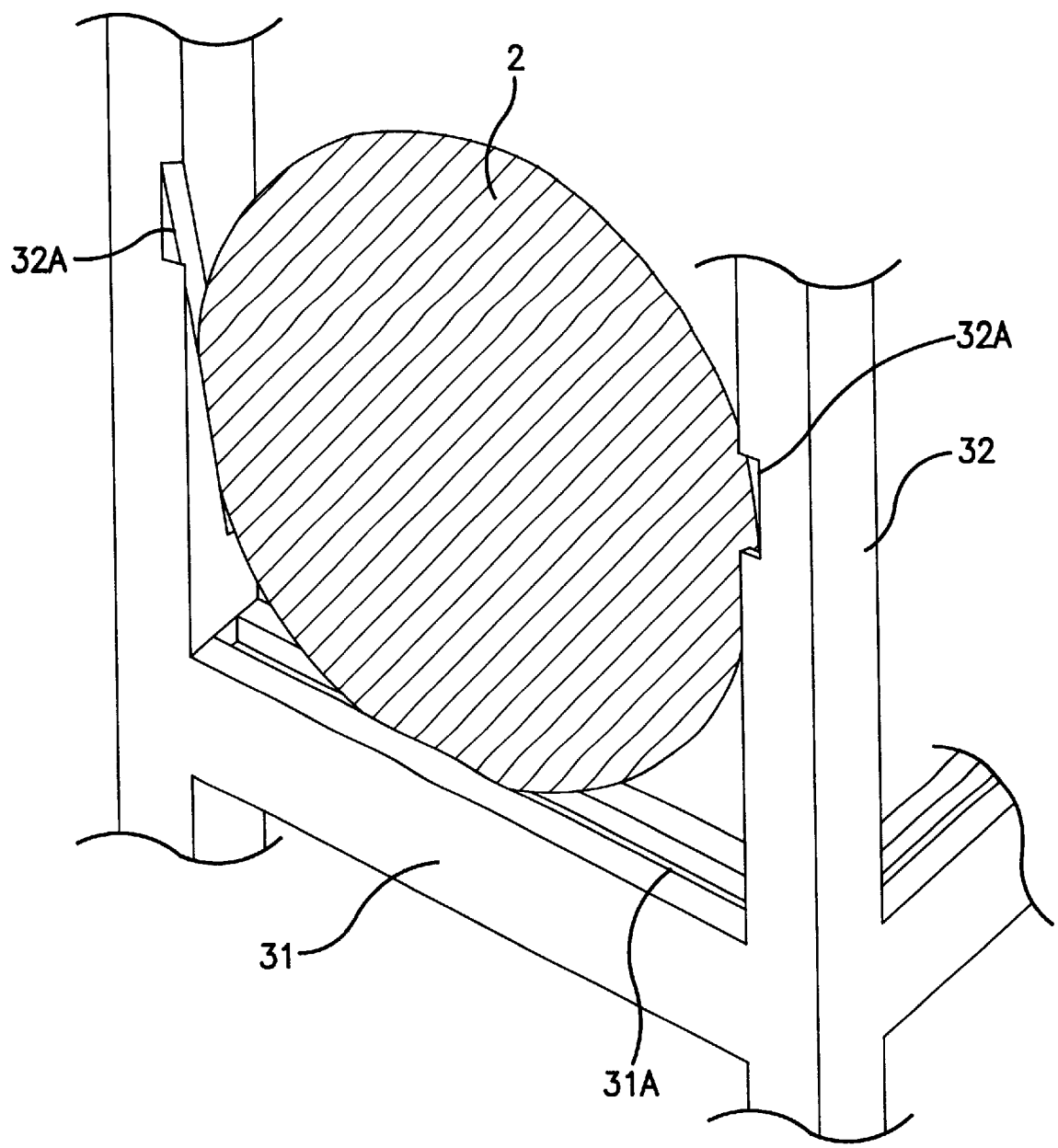
FIG. 5 is a fragmentary enlarged perspective view illustrative of a holder for holding semiconductor wafers provided in furnace core tube of a novel apparatus for diffusing an impurity into semiconductor wafers in a preferred embodiment in accordance with the present invention.

A first embodiment according to the present invention will be described in detail with reference to FIGS. 3, 4 and 5. FIG. 3 is a schematic cross sectional elevation view illustrative of a novel apparatus for diffusing an impurity into semiconductor wafers. FIG. 4 is a plane view illustrative of a furnace core tube of the novel apparatus of FIG. 3. FIG. 5 is a fragmentary enlarged perspective view illustrative of a holder for holding semiconductor wafers provided in the furnace core tube of FIG. 4.

The novel diffusion apparatus has a diffusion furnace tube 1 which is cylindrically shaped so as to have a longitudinal center axis extending along a vertical direction. The diffusion furnace tube 1 accommodates an assemble of quartz boards 3 for holding semiconductor wafers 2. The assemble of quartz boards 3 extends in a vertical direction. The assemble of quartz boards 3 also has a rotational center axis extending in the vertical direction so that the assemble of quartz boards 3 rotates around the rotational center axis. The diffusion furnace tube 1 also has a gas injector 6 vertically extending in the vicinity of an inner wall of the diffusion furnace tube 1. The gas injector 6 has a single vertical alignment of a plurality of gas injection nozzles 6A for blowing an impurity gas toward the longitudinal center axis of the assemble of quartz boards 3 in a diametrically inward direction. The assemble of the quartz boards 3 comprises plural stages, each of which has a cubit shape having four side faces, each of which holds a single semiconductor wafer 2 so that the each step holds the four semiconductor wafers 2, wherein each of the semiconductor wafers 2 rotates around the rotational axis of the assemble of the quartz boards 3 so as to keep a normal of the semiconductor wafers 2 directed in a diametrically outward direction from said rotational center axis of the assemble of the quartz boards 3. The apparatus also has a heater 8 provided to surround the diffusion furnace tube 1 for heating the diffusion furnace tube 1. The apparatus also has a mass flow controller and an impurity source container 4 as described in the prior art. The quartz board 3 comprises a pair of poles 32 vertically extending to have a predetermined distance defined by a diameter of the semiconductor wafer 2 and a beam 31 horizontally extending between the poles 32. The beam 31 has a groove 31A receiving a bottom of the semiconductor wafer 2. The poles 32 also have grooves 32A receiving diametrically opposite side ends of the semiconductor wafer 2. The grooves 32A extend in parallel to a longitudinal direction of the poles 32. Alternatively, the grooves 32A may extend in a direction oblique to the longitudinal direction of the poles 32 by an angle in the range of more than 0 degree to not larger than 10 degrees, so as to facilitate picking up the semiconductor wafer 2. The assemble of the quartz boards 3 may elevate by an elevator which is not illustrated. This elevator has a feature for rotating the assemble of the quartz boards 3 in the vertically extending rotational axis. The assemble of the quartz boards 3 may have various stages, for example, 3 to 20 stages.

The diffusion process for diffusing the impurity into the wafers is carried out as follows.

Three to eight semiconductor wafers are loaded onto each of the stages of the assemble of the quartz boards 3. The semiconductor wafer 2 is inserted along the groves 32A of the poles so that a bottom of the semiconductor wafer 2 is engaged within the groove 31A of the beam 31. The assemble of the quartz boards 3 is inserted into the diffusion furnace tube 1 heated up to a predetermined temperature in the range of 800–1000° C. so that the diffusion furnace tube 1 rotates around the rotational axis vertically extending at a rotational rate of 1–10 rpm.

A nitrogen gas is introduced through the mass flow controller 5 into the impurity source container 4 at a predetermined flow rate of 1–5 liters/min. for forming an impurity gas which is to be supplied through the gas injector 6 and the gas injection nozzles 6A into the diffusion furnace tube 1.

The semiconductor wafers 2 are loaded on the assemble of the quartz boards 3 so that the semiconductor wafers 2 vertically stand. During rotation of the assemble of the quartz boards 3 along with the semiconductor wafers 2, faces of the semiconductor wafers 2 remain directed in diametrically outward directions. A difference in distance of the center of the wafer 2 to the gas injection nozzle 6A from the peripheral portion of the wafer to the same gas injection nozzle 6A is not so large, whereby the impurity gas is almost uniformly supplied onto the entire surfaces of each of the semiconductor wafers. If, for example, the wafer has a diameter of 150 millimeters and four semiconductor wafers 2 are loaded on each stage of the assemble of the quartz boards 3, a difference in distance of the center of the wafer 2 to the gas injection nozzle 6A from the peripheral portion of the wafer to the same gas injection nozzle 6A is only 31 millimeters. Notwithstanding, if the same size wafer is loaded to lie horizontally so that the normal of the semiconductor wafer 2 is parallel to the vertically extending rotational axis, a difference in distance of the center of the wafer 2 to the gas injection nozzle 6A from the peripheral portion of the wafer to the same gas injection nozzle 6A is only 75 millimeters.

Oxygen and nitrogen gases are fed through a gas feeding pipe 7 into the diffusion furnace tube 1, at flow rates of 0.1–5 liters/min. and 5–30 liters/min., respectively, so that those gases are reacted with the impurity gas on the surfaces of the semiconductor wafers 2, whereby a glass layer containing impurities such as phosphorus glasses is formed on the surfaces of each of the semiconductor wafers 2. Subsequently, a heat treatment is carried out to diffuse the impurity from the glass layer into the semiconductor wafer 2. The diffused impurity in the semiconductor wafer 2 is further activated by a further heat treatment so that the activated impurity serves as an n-type impurity or a donor in the semiconductor wafer.

When the impurity diffusion process is carried out by use of a vertical type diffusion furnace, it is necessary to prevent diffusions of other impurities than the diffusion-purpose impurity, for example, prevent the diffusions of metals and alkyl ions. For this purpose, the high purity quartz boards for supporting the wafer is preferable other than use of a more complicated mechanism such as clump. In place of the quartz boards, high purity silicon carbide and polycrystalline silicon are also preferably useable.

In accordance the present invention, the above novel structure for holding the semiconductor wafers allows a in-plane uniform supply of an impurity onto an entire surface of each of the semiconductor wafers, whereby a in-plane uniform diffusion of the impurity over the entire surface of the semiconductor wafer is caused and an in-plane uniform impurity concentration over the entire surface of the semiconductor wafer is obtained. This further allows improvements in in-plane uniformity of characteristics of the semiconductor devices such as transistors on the semiconductor wafers.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An apparatus for diffusing an impurity into a semiconductor wafer comprising:

a diffusion furnace tube which has a longitudinal center axis extending along a vertical direction and said diffusion tube having at least a gas injector vertically extending in a vicinity of an inner wall of said diffusion furnace tube and said gas injector having a single vertical alignment of a plurality of gas injection nozzles for blowing an impurity gas toward said longitudinal center axis in a first horizontal direction; and a wafer holder for holding at least one semiconductor wafer, said wafer holder being provided in said diffusion furnace tube so that said wafer holder rotates around a rotational axis extending along said vertical axis, whereby said at least one semiconductor wafer rotates around said rotational axis so as to keep a normal between said at least one semiconductor wafer and said rotational center axis, wherein when a center of said at least semiconductor wafer comes close to said injection nozzles, an included angle between said first horizontal direction along which said impurity gas is blown and a normal of said at least semiconductor wafer is in a range of 90 degrees ±10 degrees.

2. The apparatus as claimed in claim 1, wherein said wafer holder comprises a plurality of stages, each of which has a rectangular parallelepiped shape having four side faces arranged to surround said rotational axis and a pair of top and bottom faces vertical to said rotational axis, and each of said four side faces has at least one of said single semiconductor wafer in parallel to said face.

3. The apparatus as claimed in claim 1, wherein said wafer holder comprises a plurality of stages, each of which has a cubit shape having four side faces arranged to surround said rotational axis and a pair of top and bottom faces vertical to said rotational axis, and each of said four side faces has at least one of said single semiconductor wafer in parallel to said face.

* * * * *